(12) United States Patent
Tu et al.

(10) Patent No.: US 10,157,976 B2
(45) Date of Patent: Dec. 18, 2018

(54) CAPACITOR AND METHOD FOR MAKING SAME

(71) Applicant: Taiwan Semiconductor Manufacturing Company, Ltd., Hsin-Chu (TW)

(72) Inventors: Kuo-Chi Tu, Hsin-Chu (TW); Wen-Chuan Chiang, Hsin-Chu (TW); Chen-Jong Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/412,583

(22) Filed: Jan. 23, 2017

(65) Prior Publication Data

US 2017/0133452 A1    May 11, 2017

Related U.S. Application Data

(60) Continuation of application No. 14/103,307, filed on Dec. 11, 2013, now Pat. No. 9,553,095, which is a
(Continued)

(51) Int. Cl.
*H01L 27/11* (2006.01)
*H01L 49/02* (2006.01)
(Continued)

(52) U.S. Cl.
CPC .......... *H01L 28/60* (2013.01); *H01L 23/5223* (2013.01); *H01L 27/105* (2013.01);
(Continued)

(58) Field of Classification Search
CPC .............. H01L 23/5223; H01L 27/105; H01L 27/1052; H01L 27/108; H01L 27/10894;
(Continued)

(56) References Cited

U.S. PATENT DOCUMENTS 6,677,637 B2   1/2004   Bernstein et al.
6,737,728 B1   5/2004   Block et al.
(Continued)

*Primary Examiner* — Joseph Galvin, III
(74) *Attorney, Agent, or Firm* — Slater Matsil, LLP

(57) ABSTRACT

A system-on-chip (SOC) device comprises a first capacitor in a first region, a second capacitor in a second region, and may further comprise a third capacitor in a third region, and any additional number of capacitors in additional regions. The capacitors may be of different shapes and sizes. A region may comprise more than one capacitor. Each capacitor in a region has a top electrode, a bottom electrode, and a capacitor insulator. The top electrodes of all the capacitors are formed in a common process, while the bottom electrodes of all the capacitors are formed in a common process. The capacitor insulator may have different number of sub-layers, formed with different materials or different thickness. The capacitors may be formed in an inter-layer dielectric layer or in an inter-metal dielectric layer. The regions may be a mixed signal region, an analog region, a radio frequency region, a dynamic random access memory region, and so forth.

20 Claims, 9 Drawing Sheets

Related U.S. Application Data division of application No. 13/267,424, filed on Oct. 6, 2011, now Pat. No. 8,617,949, which is a continuation-in-part of application No. 12/618,021, filed on Nov. 13, 2009, now Pat. No. 8,143,699.

(60) Provisional application No. 61/527,669, filed on Aug. 26, 2011.

(51) Int. Cl.
  *H01L 23/522* (2006.01)
  *H01L 27/105* (2006.01)
  *H01L 27/108* (2006.01)

(52) U.S. Cl.
  CPC ........ *H01L 27/108* (2013.01); *H01L 27/1052* (2013.01); *H01L 27/10894* (2013.01); *H01L 27/11* (2013.01); *H01L 27/1116* (2013.01); *H01L 28/40* (2013.01); *H01L 2924/0002* (2013.01)

(58) Field of Classification Search
  CPC ...... H01L 27/11; H01L 27/1116; H01L 28/40; H01L 28/60
  See application file for complete search history.

(56) References Cited

U.S. PATENT DOCUMENTS

| | | |
|---|---|---|
| 6,781,185 B2 | 8/2004 | Chen et al. |
| 6,803,641 B2 | 10/2004 | Papa Rao et al. |
| 6,936,881 B2 | 8/2005 | Yeo et al. |
| 6,937,457 B2 | 8/2005 | Shih et al. |
| 6,940,705 B2 | 9/2005 | Yeo et al. |
| 6,984,861 B2 | 1/2006 | Yamada et al. |
| 7,195,970 B2 | 3/2007 | Tu et al. |
| 7,301,217 B2 | 11/2007 | Chung |
| 2002/0003280 A1 | 1/2002 | Kohyama |
| 2003/0178665 A1 | 9/2003 | Takenaka |
| 2004/0248359 A1 | 12/2004 | Hieda |
| 2006/0274477 A1 | 12/2006 | Basceri et al. |
| 2008/0122032 A1* | 5/2008 | Tu ............... H01L 28/55 257/532 |
| 2008/0217738 A1 | 9/2008 | Wang |
| 2010/0065944 A1 | 3/2010 | Tu et al. |
| 2010/0164063 A1* | 7/2010 | Yun ............... H01L 27/101 257/532 |
| 2010/0172065 A1 | 7/2010 | Huang et al. |
| 2010/0213572 A1 | 8/2010 | Ching et al. |
| 2012/0091519 A1 | 4/2012 | Tu |

\* cited by examiner

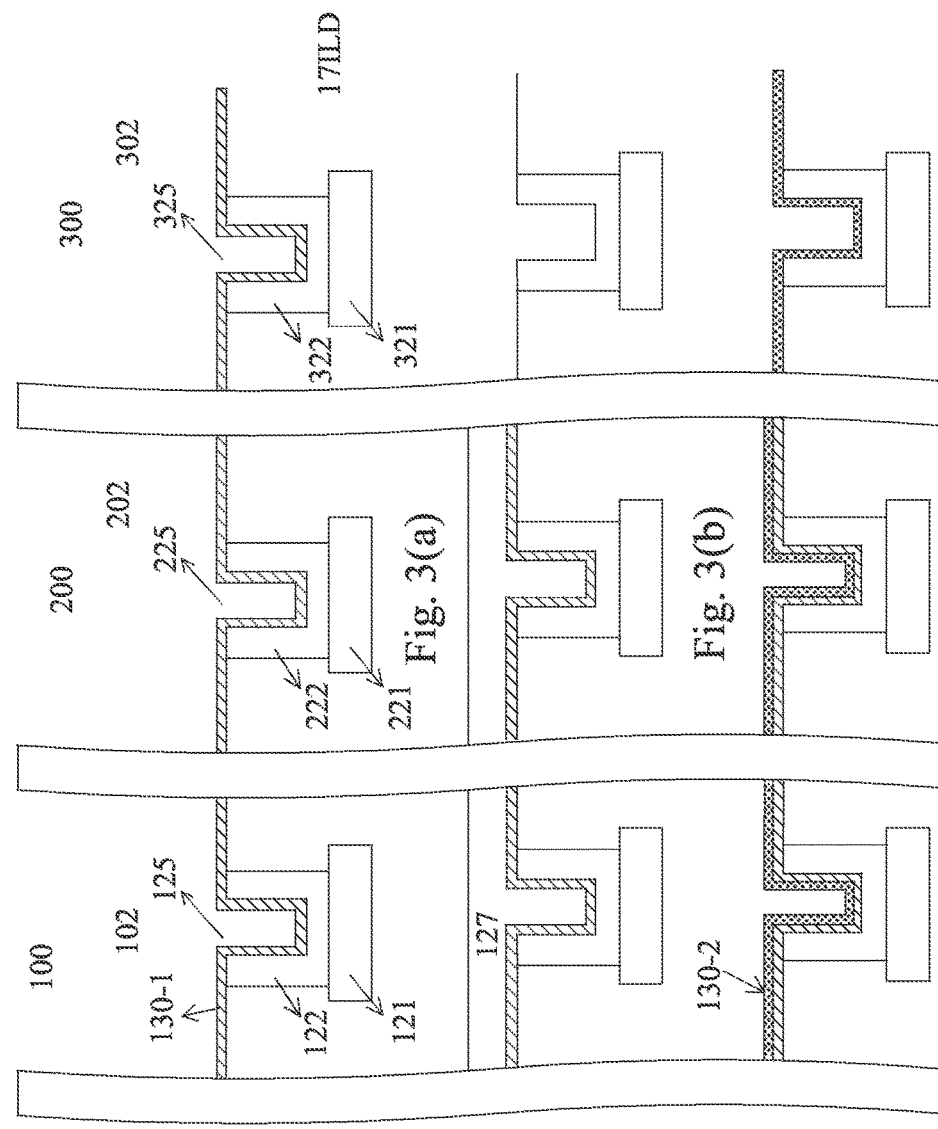

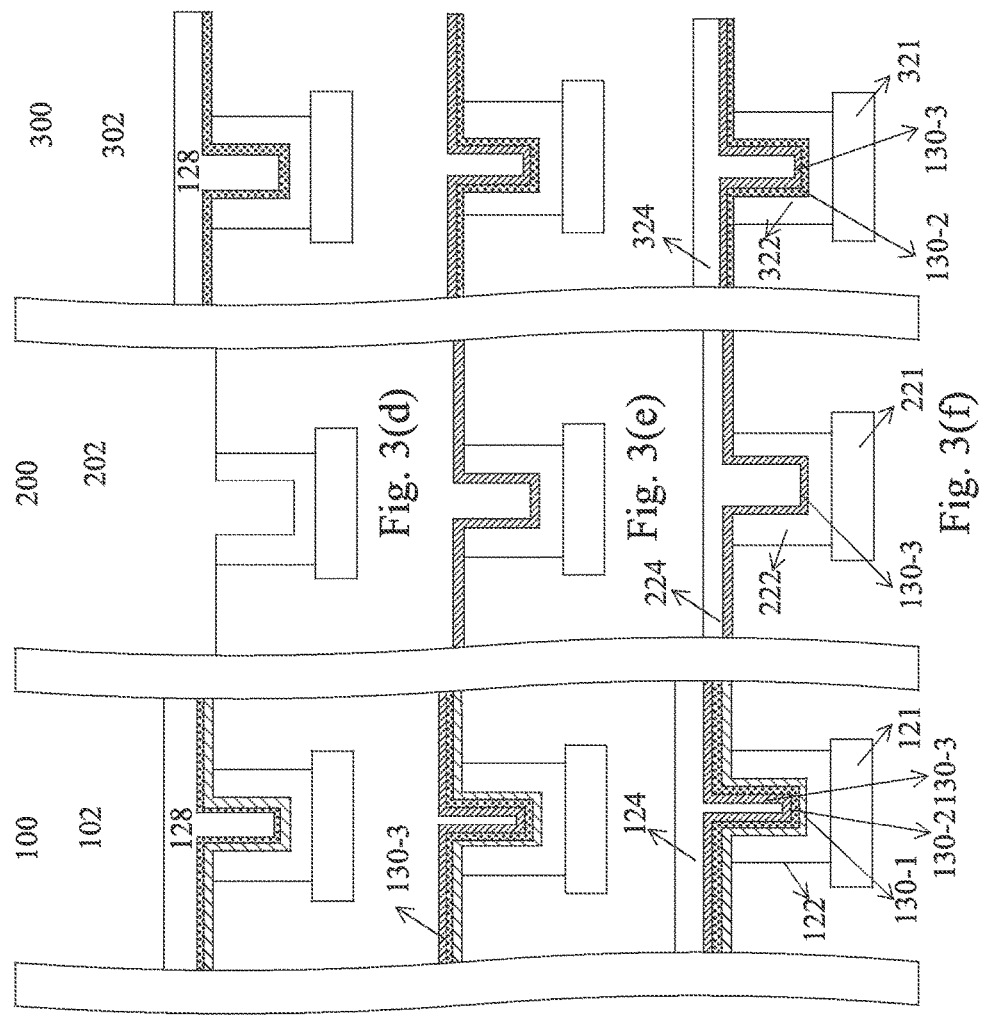

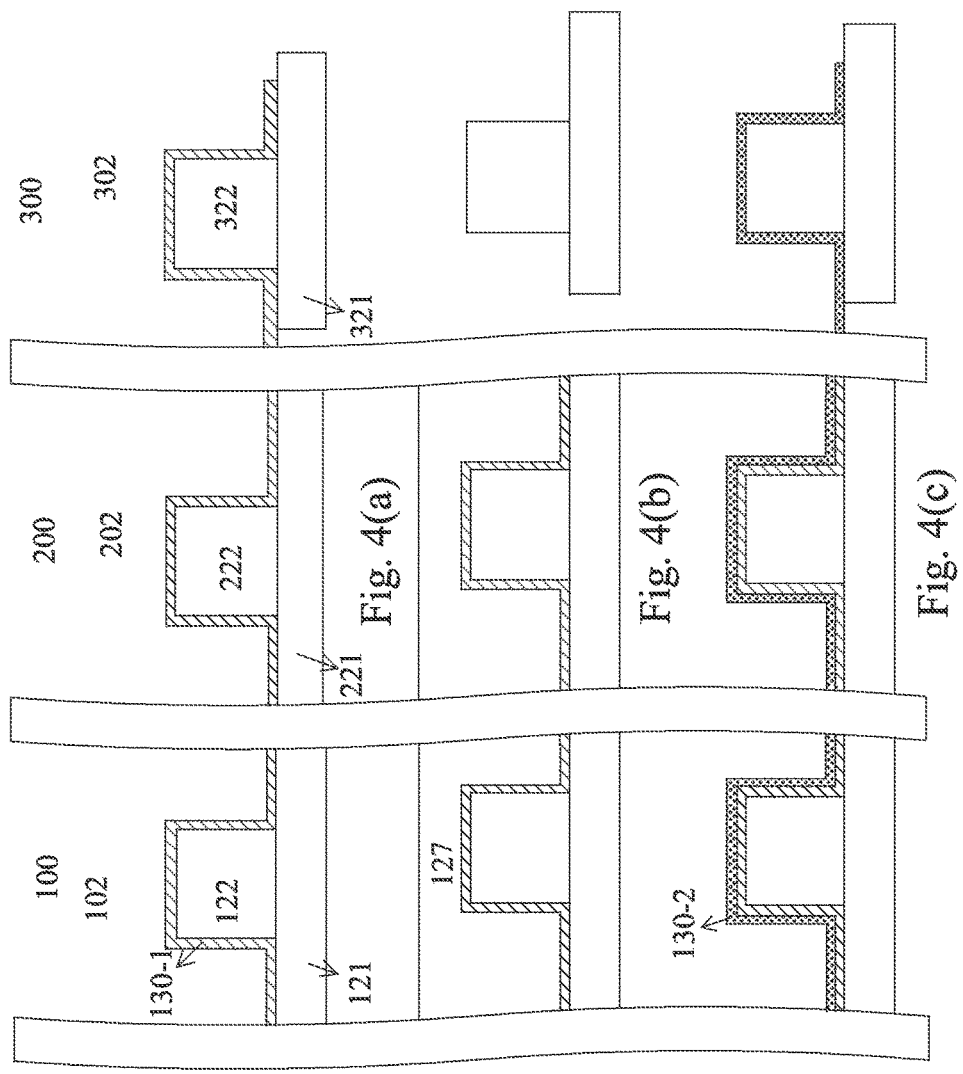

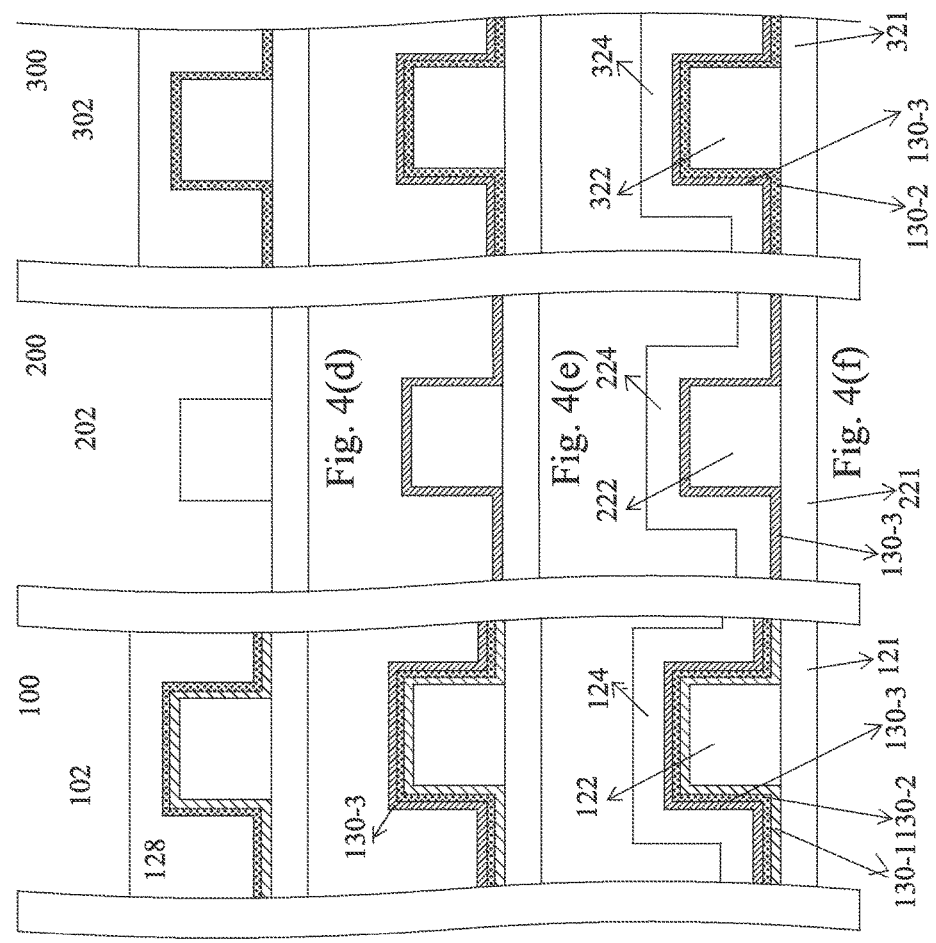

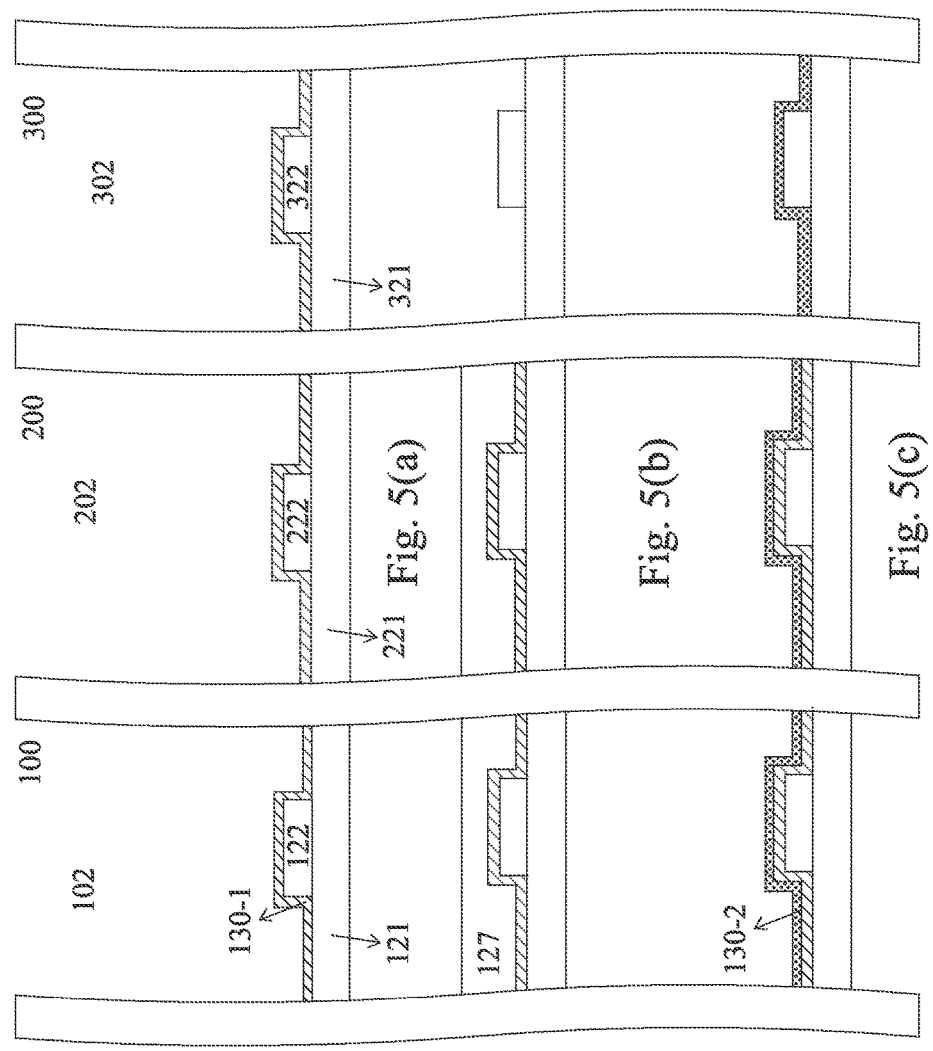

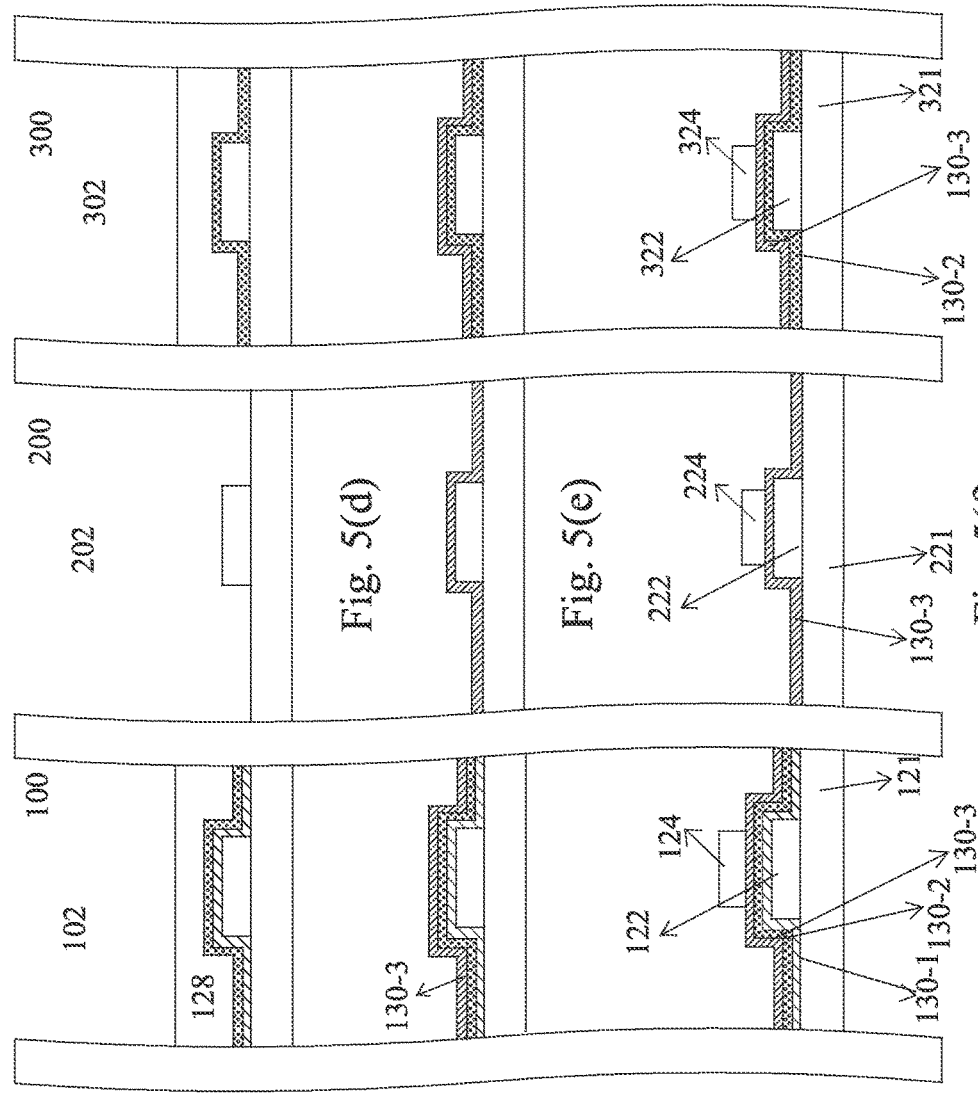

CAPACITOR AND METHOD FOR MAKING SAME

This application is a continuation of U.S. application Ser. No. 14/103,307, filed Dec. 11, 2013, entitled, "Capacitor and Method for Making Same," which is a divisional of U.S. application Ser. No. 13/267,424, filed Oct. 6, 2011, entitled, "Capacitor and Method for Making Same," now U.S. Pat. No. 8,617,949, issued Dec. 31, 2103, which is a continuation-in-part of U.S. patent application Ser. No. 12/618,021, filed on Nov. 13, 2009, entitled "Dual-Dielectric MIM Capacitors for System-on-Chip Applications," now U.S. Pat. No. 8,143,699, issued Mar. 27, 2012, which application claims the benefit of U.S. Provisional Application No. 61/527,669 filed on Aug. 26, 2011, entitled "Capacitor and Method for Making Same," which applications are hereby incorporated herein by reference.

BACKGROUND

Many kinds of capacitors such as metal-oxide-semiconductor (MOS) capacitors, PN junction capacitors, polysilicon-insulator-polysilicon (PIP) capacitors, and metal-insulator-metal (MIM) capacitors are used in semiconductor devices. In particular, the MIM capacitor offers reduced electrode resistance with wide ranges of applications.

MIM capacitors have been widely used in functional circuits such as mixed signal circuits, analog circuits, radio frequency (RF) circuits, dynamic random access memory (DRAM), embedded DRAM, and logic operation circuits. In system-on-chip applications, different capacitors for different functional circuits have to be integrated on a same chip to serve different purposes. For example, in mixed signal circuits, capacitors are used as decoupling capacitors and high-frequency noise filters. For DRAM and embedded DRAM circuits, capacitors are used for memory storage; while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

With the capacitors having different functions formed in different metal layers, the capacitors may work under different operation voltages. For example, when used as decoupling capacitors, the capacitors need to be able to sustain high voltages. Therefore, the capacitor insulators need to be thick. In DRAMs, on the other hand, the operation voltage is low, and the capacitors need to be small in order to increase the DRAM cell density. Therefore, the capacitor insulators need to be thin.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3a-5f illustrate embodiments of processes of fabricating three capacitors in three regions with different numbers of sub-layers.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the invention, and do not limit the scope of the invention.

It is realized that for a system-on-chip (SoC) application, different functional capacitors may be needed in different functional regions (circuits), such as a mixed signal region, an analog region, a radio frequency (RF) region, a dynamic random access memory (DRAM) region, a logic region, and a static random access memory (SRAM) region. To reduce the manufacturing cost and to reduce the process complexity, all these capacitors may be manufactured in a common process, e.g., substantially simultaneously, in a substantially same level, for example, in a same metal layer. Accordingly, all of the insulators in the capacitors have a same thickness and are formed of a same material. However, this results in a dilemma. For example, in order to accommodate the high voltage in the mixed signal regions, the analog regions, or the like, the decoupling capacitors need to have thick capacitor insulators. However, thicker capacitor insulators result in smaller capacitance per unit chip-area. As a result, DRAM capacitors, which may have high densities, are forced to occupy greater chip areas. Conversely, to suit the high-density requirement of the DRAM capacitors, the capacitor insulators need to be thin. This, however, means that the reliability of the capacitors in the mixed signal region and the analog region may be sacrificed due to the reduced insulator thickness.

To solve the above-discussed dilemma, a novel integration scheme for integrating different functional metal-insulator-metal (MIM) capacitors on a same SoC chip and the corresponding structures is provided. A MIM capacitor may be a capacitor having a stacked structure, for example, including a bottom electrode, a top electrode, and an insulator therebetween. The intermediate stages of manufacturing exemplary embodiments are also illustrated. Throughout the various views and illustrative embodiments, like reference numbers are used to designate like elements.

Figure 1:
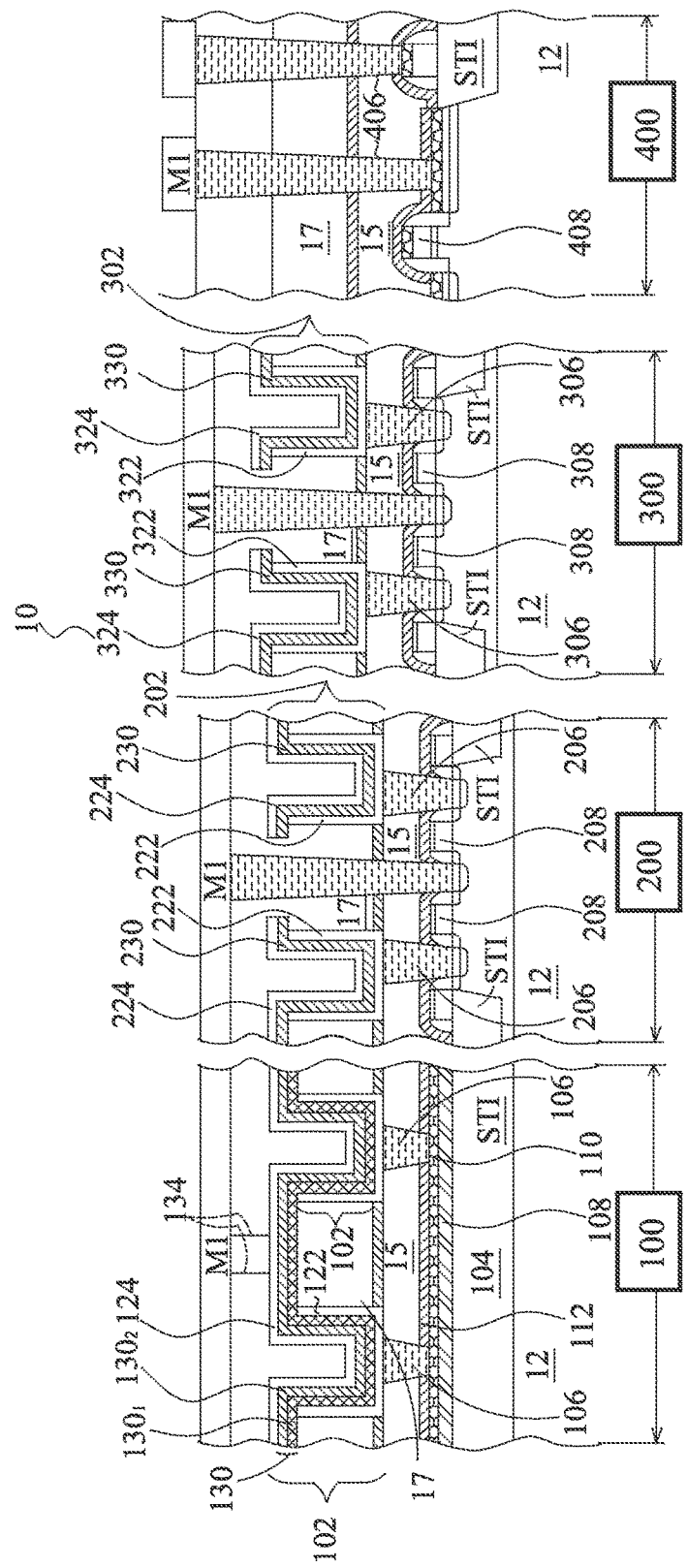
FIG. 1 illustrates an embodiment of four regions where one capacitor is located within one region for three regions while the top electrode and the bottom electrode of the capacitors are formed in a common process.

FIG. 1 illustrates an exemplary embodiment. Semiconductor chip 10, which has system-on-chip (SoC) applications built therein, is provided. Chip 10 comprises region 100, region 200, region 300, and region 400. In an embodiment, region 100, 200, and 300 may be a mixed signal region, an analog region, a radio frequency (RF) region, respectively, or a combined region including more than one of these regions. Region 400 may be a logic region having core (logic) devices, a static random access memory (SRAM) region, or a combined region including both logic and SRAM circuits. Chip 10 includes substrate 12 that expands through regions 100, 200, 300, and 400. Substrate 12 may be a silicon substrate, or a substrate comprising other semiconductor materials, such as group III, group IV, and/or ground V elements. Layers 15 and 17 are inter-layer dielectrics (ILD).

In region 100, capacitor 102 is formed. Shallow trench isolation (STI) region 104 is formed in substrate 12 and vertically overlaps capacitor 102, wherein the area of STI region 104 is preferably greater than, although it may also be equal to or slightly less than, the area of capacitor 102. In an embodiment, STI region 104 fully vertically overlaps all of the overlying capacitor 102, and may further expand beyond the edges of capacitor 102 in lateral directions (the directions parallel to the surface of substrate 12). In other embodiments, STI region 104 has an area greater than about 90 percent of the area of capacitor 102. In an embodiment, capacitor 102 is formed in ILD 17, which is lower than the bottom metallization layer (commonly known as M1). Please note that ILD 17 may be the dielectric layer covering gates 208, 308, and 408. In this case, capacitor 102 is connected to contact plugs 106, which may be formed of tungsten. In region 100, polysilicon strip 108 is formed. Silicide 110 is formed on polysilicon strip 108 by a silicidation process. Contact etch stop layer (CESL) 112 is formed on silicide 110. Polysilicon strip 108, silicide 110, and CESL 112 may be formed in a common process, and hence comprise the same materials as gates 208, 308, and 408, gate silicides and source (or drain) silicides, and the CESLs in regions 200, 300, and 400, respectively. Similarly, the illustrated contact plugs 106, 206, 306, and 406 may be formed in a common process using a same conductive material. It is noted that capacitor 102 may have its bottom electrode 122 interconnected through contact plugs 106 and silicide 110, and its top electrode 124 interconnected by itself. As a result, capacitor 102 may act as a single capacitor. Throughout the description, bottom electrode 122 and other bottom electrodes and top electrodes may be formed of titanium nitride (TiN) or combinations of titanium (Ti) with titanium nitride, tantalum nitride (TaN), tungsten (W), tungsten nitride (WN), ruthenium (Ru), iridium (Ir), and platinum (Pt). Generally, low-resistivity materials may be used.

Capacitor 202 is formed in IDL 17 of region 200, and may be used as the storage capacitor of a DRAM cell or provide other functions. The bottom electrodes 122 within region 100 and 222 within region 200 may be formed in a common process, and hence are formed of a same conductive material, have a same thickness, and essentially at the same level. Further, the top electrodes 124 within region 100 and 224 within region 200 are formed in a common process, and hence are formed of a same conductive material, have a same thickness, and essentially at the same level. Capacitors 102 and 202 may comprise vertical portions (sidewall portions) and horizontal portions (bottom portions), and hence are also referred to as three-dimensional (3D) capacitors, since capacitors 102 and 202 not only extend in the direction parallel to the top surface of substrate 12, but also in a vertical direction perpendicular to the top surface of substrate 12. This advantageously increases the capacitance per unit chip-area.

Capacitor 302 is further formed in IDL 17 of region 300, and may be used as the storage capacitor of a DRAM cell or perform other functions. Similarly, the bottom electrodes 122, 222, and 322 may be formed in a common process, and hence are formed of a same conductive material, have a same thickness, and essentially at the same level. Further, the top electrodes 124, 224, and 324 are formed in a common process, and hence are formed of a same conductive material, have a same thickness, and essentially at the same level. Capacitors 102, 202, and 302 may be 3D capacitors, since capacitors 102, 202, and 302 not only extend in the direction parallel to the top surface of substrate 12, but also in a vertical direction perpendicular to the top surface of substrate 12. This advantageously increases the capacitance per unit chip-area.

Furthermore, there may be no capacitors in region 400. Region 400 may be a logic region having core (logic) devices, a static random access memory (SRAM) region, or a combined region including both logic and SRAM circuits.

In an illustrative embodiment, as shown in FIG. 1, capacitor 102 may comprise a capacitor insulator 130 between, and contacting, bottom electrode 122 and top electrode 124. Unless specified otherwise, insulator 130 and other insulators discussed in the specification may include silicon dioxide ($SiO_2$), silicon nitride ($Si_3N_4$), aluminum oxide ($Al_2O_3$), hafnium silicates (HfSiON), tantalum oxide ($Ta_2O_5$), zirconium oxide ($ZrO_2$), hafnium oxide ($HfO_2$), titanium oxide ($TiO_2$), barium strontium titanate oxide (BST), strontium titanate oxide (STO), and combinations thereof. Capacitor 202 includes capacitor insulator 230 between, and contacting, respective bottom electrode 222 and top electrode 224. Similarly, capacitor 302 includes capacitor insulator 330 between, and contacting, respective bottom electrode 322 and top electrode 324.

The capacitor insulator 130 includes capacitor dielectric layer $130_1$ and layer $130_2$, wherein layer $130_1$ is formed in a common process as, and hence comprises a same material, and has a same thickness, as capacitor insulator 230 and 330. Capacitors 202 and 302 however, do not include any layer that is formed in a common process with capacitor dielectric layer $130_2$. Accordingly, capacitor 102, with two dielectric layers stacked together, has a greater breakdown voltage, and hence improved reliability. This is particularly desirable since the voltages applied to capacitor 102 are often high, for example, when used as decoupling capacitors with one of the bottom electrode 122 and top electrode 124 connected to voltage VDD, and the other one connected to voltage VSS. In FIG. 1, dotted lines 134 illustrate a contact connecting top electrode 124 to a M1 metal line. In this case, the M1 metal line may be a VDD power line or a VSS power line.

In some other embodiments, the layer $130_2$ instead of the layer $130_1$ is formed in a common process as, and hence comprises a same material, and has a same thickness, as capacitor insulator 230 and 330. In either case, capacitors 202 and 302, have only one dielectric layer, and hence can endure lower operation voltage than capacitor 102, and therefore may be used in low voltage applications. With thin capacitor insulators, capacitors 202 and 302 have a high capacitance per unit chip-area. This is desirable since a DRAM array may include many storage capacitors, and hence the increased capacitance per unit chip-area is advantageous for increasing the density of the DRAM array.

Capacitors 202 and 302 are only shown for illustration purposes and are not limiting. Other embodiments may comprise other forms of capacitors 202 and 302. For example, capacitor 302 may have two dielectric layers formed at the same time as the dielectric layer $130_1$ and layer $130_2$, while capacitor 202 has only one dielectric layer. Capacitors 202 and 302 may both have two dielectric layers as the dielectric layer $130_1$ and layer $130_2$ formed in capacitor 102.

The number of regions 100, 200, 300, and 400, and the capacitors 102, 202, and 302 are only for illustrative purposes and are not limiting. For some other embodiments, there may be two regions 100 and 200 comprising two capacitors 102 and 202 in addition to the region 400, without the region 300 and the capacitor 302 within. For some other embodiments, there may be more than three regions 100, 200, 300 that comprise capacitors 102, 202, and 302. For example, there may be four regions with a MIM capacitor or more within each region, while each region may be a mixed signal region, an analog region, a radio frequency (RF) region, or a combined region including more than one of these regions.

Figure 2:
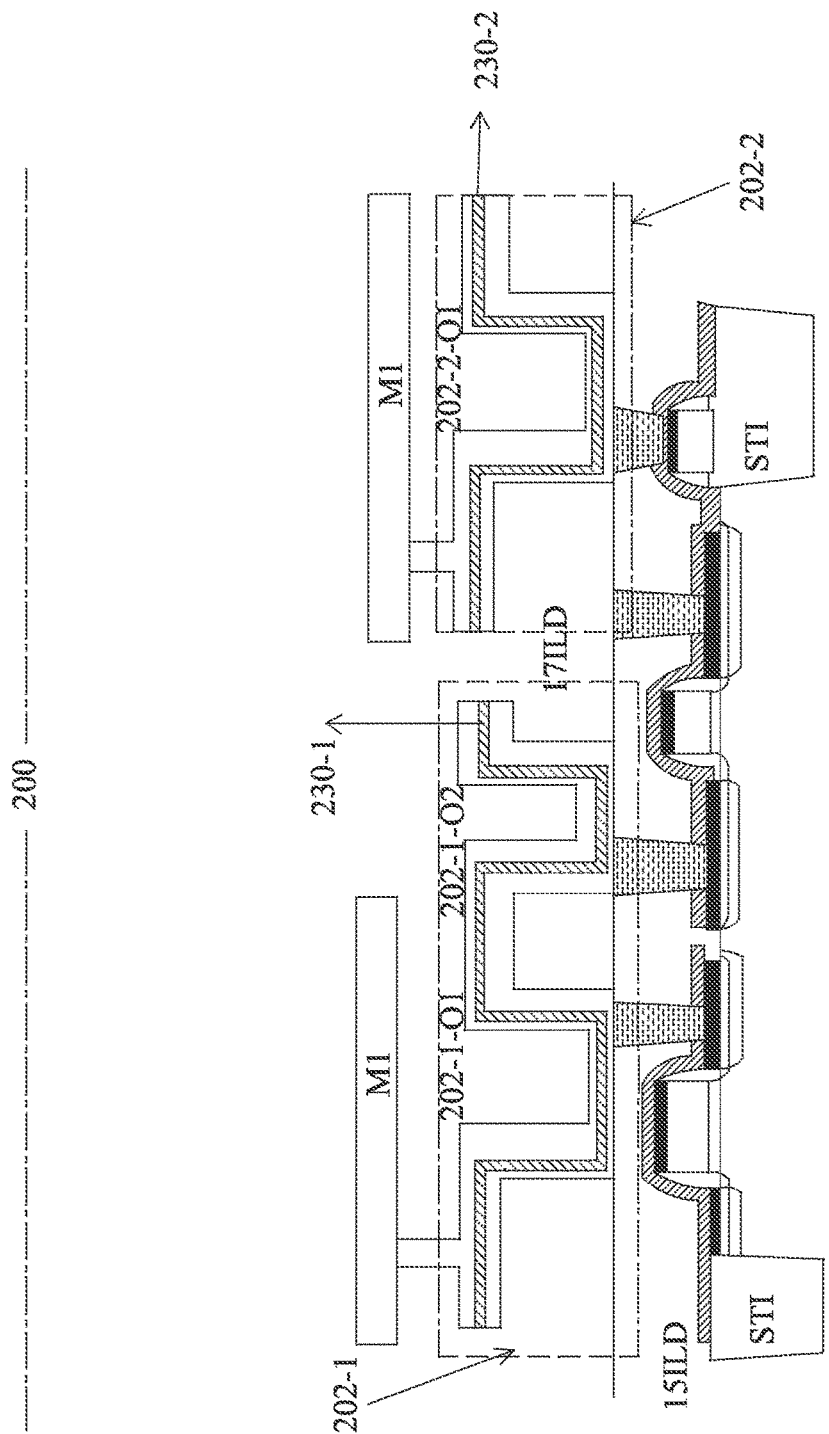
FIG. 2 illustrates an embodiment wherein one of the regions may have multiple capacitors with different capacitor insulators.

In FIG. 1, each region 100, 200, and 300 has only one capacitor. In other embodiments, there may be more than one capacitor within a region. FIG. 2 illustrates one exemplary region, such as region 200 in FIG. 1. The capacitors shown in region 200 are only for illustration purposes and are not limiting. Capacitors in other regions such as region 100, 300 can have similar variations as shown for region 200.

In FIG. 2, there are two non-connected capacitors 202-1 and 202-2 formed in IDL 17 of region 200, which may be used as the storage capacitors of DRAM cells or perform other functions. The capacitor 202-1 has two openings 202-1-o1 and 202-1-o2, while the capacitor 202-2 has only one opening 202-2-o1. The number of openings is only for illustration purposes and is not limiting. There may be more than two openings. The size of the two openings may be different. For example, the two openings 202-1-o1 and 202-1-o2 have different sizes.

In addition, FIG. 2 illustrates an embodiment, wherein the capacitor 202-1 and 202-2 have only one layer of capacitor insulator 230-1 and 230-2 formed respectively. Moreover, the capacitor insulator 230-1 and 230-2 may either be formed of a different material, or have a different thickness, from each other, and may or may not be different from other capacitor insulators 130 in region 100 and 330 in region 300 of FIG. 1. In embodiments of the disclosure, capacitor insulators are referred to as being different from each other if they comprise at least one different material, or have a different thickness in at least one of the sub layers. In other words, the capacitor insulators are different unless they have a same thickness and are formed of a same material.

With the capacitor insulators in regions being different from each other, the insulators for each type of capacitor may be customized as needed, and hence the chip area occupied by the capacitors may be minimized without sacrificing the reliability (e.g., the endurance to the voltages) of the capacitors. This is particularly advantageous since both DRAM capacitors (for their big number) and decoupling capacitors may occupy large chip areas, thus being able to customize the insulators of capacitors is important.

In addition, besides the above-discussed dual-dielectric or single-dielectric capacitors, triple-dielectric or other multi-capacitor-insulator capacitors may be formed with even more capacitor insulator layers. Different combinations of capacitor insulator layers may be made to minimize the process steps. However, at least the formation processes of the top electrodes and the bottom electrodes of different capacitors may be combined. Furthermore, capacitors with other shapes and forms may be formed in regions 100, 200, and 300, or other number of regions.

FIG. 3(f) illustrates exemplary MIM capacitors 102, 202, and 302 formed in region 100, 200, and 300 respectively by a process shown in FIGS. 3(a)-3(f). The capacitors may comprise a bottom electrode 122, 222, and 322 which are formed in a common process, and top electrode 124, 224, and 324 which are formed in a common process. A bottom electrode pick-up 121, 221, and 321 are formed and connected to the bottom electrode 122, 222, and 322 respectively, to connect to a metal layer down or the gates of transistors. A top electrode pick-up may be formed as well (not shown). The capacitors 102, 202, and 302 may be of cylindrical shape and FIGS. 3(a)-3(f) show only the cross-section view. They may be other shapes such as a concave shape. FIG. 3(f) is only for illustrative purposes and is not limiting. For example, there may be more than one capacitor so formed by the illustrative process in each region.

The capacitors 102, 202, and 302 in FIG. 3(f) may be fabricated by an illustrative process shown in FIGS. 3(a)-(f). In FIG. 3(a), the illustrative process starts with forming a metal contact 121, 221, and 321, sometimes also referred to as a bottom electrode pick-up. An ILD 17 is formed by depositing dielectric materials such as USG oxide film. A plurality of openings 125, 225, and 325 are formed within the layers 17 on top of the metal contacts 121, 221, and 321 respectively by photolithography. The openings 125, 225, and 325 are in direct contact with the metal contacts. FIG. 3(a) is a cross-section view, and the openings 125, 225, and 325 may be shaped as a cup (i.e., openings may have a substantially circular shape when seen from above). The number, the position, the size, the width, and the shape of the openings 125, 225, and 325 are only for illustrative purposes only, but are not limiting.

FIG. 3(a) further illustrates bottom electrode material 122, 222, and 322 are deposited at the bottom and along the side wall of the openings 125, 225, and 325, respectively. The material deposited at the bottom of the openings 125, 225, and 325 is in contact with the metal contacts forming an electrical contact path. The material may be conductive materials such as TaN or TiN, or silicided metal nitride such as TaSiN, TiSiN, and WSiN. There may be multiple sub-layers (not shown) comprising the conductive materials. A chemical mechanical planarization (CMP) is used to remove any extra bottom electrode material to form the bottom electrode, which are all formed in a common process.

FIG. 3(a) further illustrates a layer of capacitor dielectric 130-1 is deposited on top of the bottom electrode 122, 222, and 322 across the three regions 100, 200, and 300, respectively, at the bottom and along the side wall of the openings 125, 225, and 325, and on top of the related surface by means including ALD, LPCVD, PECVD, and ALCVD. The material may include any capacitor dielectric such as $SiO_2$, metal nitrides, such as silicon nitride (e.g., $Si_3N_4$) or high dielectric constant (high-k) materials such as $TiO_2$, $Ta_2O_5$, $ZrO_2$, including rare earth oxides such as $Y_2O_3$, $La_2O_5$, $HfO_2$, and their aluminates and silicates.

In FIG. 3(b), a photoresist protective coating 127 is applied over the dielectric 130-1 in regions 100 and 200, but not in region 300. The protective coating 127 covers and protects all or a part of the capacitor dielectric 130-1 in region 100 and 200, so that and the same layer 130-1 in region 300 may be removed during a subsequent etching process, as shown in FIG. 3(b).

FIG. 3(c) further illustrates a second sub-layer of capacitor dielectric 130-2 is deposited on top of the first sub-layer 130-1 across the three regions 100, 200, and 300, respectively, at the bottom and along the side wall of the openings 125, 225, and 325, and on top of the surface. Subsequently, as shown in FIG. 3(d), a photoresist protective coating 128 is applied over the dielectric 130-2 in regions 100 and 300, but not in region 200. The protective coating 128 covers and protects all or a part of the capacitor dielectric 130-1 and/or 130-2 in region 100 and 300, so that and the same layer 130-2 and 130-1 in region 200 can be removed during a subsequent etching process, as shown in FIG. 3(d).

FIG. 3(e) further illustrates a third sub-layer of capacitor dielectric 130-3 is deposited across the regions 100, 200, and 300, respectively, on top of the sub-layer 130-2, and at the bottom and along the side wall of the opening 225 where no dielectric layer material remaining since it is removed in step 3(d). As the last step shown in FIG. 3(f), top electrode

124, 224, and 324 are formed in a common process in regions 100, 200, 300, on top of the sub-layer 130-3.

As the result of the above process, capacitor 102 in region 100 has three sub-layers 130-1, 130-2, and 130-3 to form the capacitor insulator, while capacitor 202 in region 200 has only one sub-layer 130-3 to form the capacitor insulator, and capacitor 302 in region 300 has two sub-layers 130-3 and 130-2 to form the capacitor insulator. The three capacitors formed in three regions have different number of sub-layers of capacitor insulator, leading to different capacitance for different functions. Moreover, the bottom electrode and the top electrode of the capacitors are formed in a common process. The number of sub-layers and the number of capacitors in each region are only shown for illustrative purposes and are not limiting.

The process shown in FIGS. 3(*a*)-3(*f*) can be similarly applied to other shapes of capacitors. FIGS. 4(*a*)-4(*f*) show how to form bar-type capacitors in each region using the same process. FIGS. 5(*a*)-5(*f*) show how to form planar type capacitors in each region using the same process. It is possible to apply the same process to form mixed shaped capacitors in different regions. For example, a cylinder type capacitor may be formed in region 100, a bar type capacitor may be formed in region 200, and a planar type or other type of capacitor may be formed in region 300, using the same process. The embodiments shown are only for illustrative purposes and are not limiting.

FIG. 4(*f*) illustrates exemplary MIM capacitors 102, 202, and 302 formed in region 100, 200, and 300 respectively by a process shown in FIGS. 4(*a*)-(*f*). The capacitors may comprise a bottom electrode 122, 222, and 322 which are formed in a common process and top electrode 124, 224, and 324 which are formed in a common process. A bottom electrode pick-up 121, 221, and 321 are formed and connected to the bottom electrode 122, 222, and 322 respectively, to connect to a metal layer down or the gates of transistors. A top electrode pick-up may be formed as well (not shown). The capacitors 102, 202, and 302 may be of bar shape and FIGS. 4(*a*)-4(*f*) show only the cross-section view. FIG. 4(*f*) is only for illustrative purposes and is not limiting. For example, there may be more than one capacitor so formed by the illustrative process in each region.

The capacitors 102, 202, and 302 in FIG. 4(*f*) may be fabricated by an illustrative process shown in FIGS. 4(*a*)-4(*f*). In FIG. 4(*a*), the illustrative process starts with forming a metal contact 121, 221, and 321, sometimes also referred to as a bottom electrode pick-up. On top of the metal contacts, a bar shaped bottom electrode 122, 222, and 322 may be formed as shown in FIG. 4(*a*), in contact with the metal contacts forming an electrical contact path. The material may be conductive materials such as TaN or TiN, or silicided metal nitride such as TaSiN, TiSiN, and WSiN. FIG. 4(*a*) is a cross-section view, and the bars 122, 222, and 322 may be shaped as a square (i.e., bars may have a substantially square shape when seen from above). The number, the position, the size, and the width of the bars 122, 222, and 322 are only for illustrative purposes only, but are not limiting.

FIG. 4(*a*) further illustrates a layer of capacitor dielectric 130-1 is deposited on top of the bottom electrode 122, 222, and 322 across the three regions 100, 200, and 300, respectively, by means including ALD, LPCVD, PECVD, and ALCVD. The material may include any capacitor dielectric such as $SiO_2$, metal nitrides, such as silicon nitride (e.g., $Si_3N_4$) or high dielectric constant (high-k) materials such as $TiO_2$, $Ta_2O_5$, $ZrO_2$, including rare earth oxides such as $Y_2O_3$, $La_2O_5$, $HfO_2$, and their aluminates and silicates.

In FIG. 4(*b*), a photoresist protective coating 127 is applied over the dielectric 130-1 in regions 100 and 200, but not in region 300. The protective coating 127 covers and protects all or a part of the capacitor dielectric 130-1 in region 100 and 200, so that and the same layer 130-1 in region 300 can be removed during a subsequent etching process, as shown in FIG. 3(*b*).

FIG. 4(*c*) further illustrates a second sub-layer of capacitor dielectric 130-2 is deposited across the three regions 100, 200, and 300, respectively, on top of the first sub-layer 130-1, or on top of the surface of the bar. Subsequently, as shown in FIG. 4(*d*), a photoresist protective coating 128 is applied over the dielectric 130-2 in regions 100 and 300, but not in region 200. The protective coating 128 covers and protects all or a part of the capacitor dielectric 130-1 in region 100 and 300, so that and the same layer 130-2 and 130-1 in region 200 can be removed during a subsequent etching process, as shown in FIG. 4(*d*).

FIG. 4(*e*) further illustrates a third sub-layer of capacitor dielectric 130-3 is deposited across the regions 100 and 300, respectively, on top of the sub-layer 130-2, and at the top of the bar 222 in region 200 where no dielectric layer material remaining since it is removed in step 4(*d*). As the last step shown in FIG. 4(*f*), top electrode 124, 224, and 324 which are formed in a common process in regions 100, 200, 300, on top of the sub-layer 130-3.

As the result of the above process, capacitor 102 in region 100 has three sub-layers 130-1, 130-2, and 130-3 to form the capacitor insulator, while capacitor 202 in region 200 has only one sub-layer 130-3 to form the capacitor insulator, and capacitor 302 in region 300 has two sub-layers 130-3 and 130-2 to form the capacitor insulator. The three capacitors formed in three regions have different number of sub-layers of capacitor insulator, leading to different capacitance for different functions. Moreover, the bottom electrode and the top electrode of the capacitors are formed in a common process. The number of sub-layers and the number of capacitors in each region are only shown for illustrative purposes and are not limiting.

FIG. 5(*f*) illustrates exemplary MIM capacitors 102, 202, and 302 formed in region 100, 200, and 300 respectively by a process shown in FIGS. 5(*a*)-5(*f*). The capacitors may comprise a bottom electrode 122, 222, and 322 which are formed in a common process and top electrode 124, 224, and 324 which are formed in a common process. A bottom electrode pick-up 121, 221, and 321 are formed and connected to the bottom electrode 122, 222, and 322 respectively, to connect to a metal layer down or the gates of transistors. A top electrode pick-up may be formed as well (not shown). The capacitors 102, 202, and 302 may be of planar shape and FIGS. 5(*a*)-5(*f*) show only the cross-section view. FIG. 5(*f*) is only for illustrative purposes and is not limiting. For example, there may be more than one capacitor so formed by the illustrative process in each region.

The capacitors 102, 202, and 302 in FIG. 5(*f*) may be fabricated by an illustrative process shown in FIGS. 5(*a*)-(*f*). In FIG. 5(*a*), the illustrative process starts with forming a metal contact 121, 221, and 321, sometimes also referred to as a bottom electrode pick-up. Bottom electrode material 122, 222, and 322 are deposited in contact with the metal contacts forming an electrical contact path. The material may be conductive materials such as TaN or TiN, or silicided metal nitride such as TaSiN, TiSiN, and WSiN. There may be multiple sub-layers (not shown) comprising the conductive materials. The extra so formed bottom electrode material may be removed by a chemical mechanical planarization (CMP) to form the bottom electrode. FIG. 5(a) is a cross-section view, and the bottom electrode 122, 222, and 322 may be shaped as a square (i.e., the area above the metal contacts may have a substantially square shape when seen from above). The number, the position, the size, and the width are only for illustrative purposes only, but are not limiting.

FIG. 5(a) further illustrates a layer of capacitor dielectric 130-1 is deposited on top of the bottom electrode 122, 222, and 322 across the three regions 100, 200, and 300, respectively, by means including ALD, LPCVD, PECVD, and ALCVD. The material may include any capacitor dielectric such as $SiO_2$, metal nitrides, such as silicon nitride (e.g., $Si_3N_4$) or high dielectric constant (high-k) materials such as $TiO_2$, $Ta_2O_5$, $ZrO_2$, including rare earth oxides such as $Y_2O_3$, $La_2O_5$, $HfO_2$, and their aluminates and silicates.

In FIG. 5(b), a photoresist protective coating 127 is applied over the dielectric 130-1 in regions 100 and 200, but not in region 300. The protective coating 127 covers and protects all or a part of the capacitor dielectric 130-1 in region 100 and 200, so that and the same layer 130-1 in region 300 can be removed during a subsequent etching process, as shown in FIG. 5(b).

FIG. 5(c) further illustrates a second sub-layer of capacitor dielectric 130-2 is deposited across the three regions 100, 200, and 300, respectively, on top of the first sub-layer 130-1, or on top of the surface of 322. Subsequently, as shown in FIG. 5(d), a photoresist protective coating 128 is applied over the dielectric 130-2 in regions 100 and 300, but not in region 200. The protective coating 128 covers and protects all or a part of the capacitor dielectric 130-1 in region 100 and 300, so that and the same layer 130-2 and 130-1 in region 200 can be removed during a subsequent etching process, as shown in FIG. 5(d).

FIG. 5(e) further illustrates a third sub-layer of capacitor dielectric 130-3 is deposited on top of the sub-layer 130-2 across the regions 100 and 300, respectively, and at the top of 222 where no dielectric layer material remaining since it is removed in step shown in FIG. 5(d). As the last step shown in FIG. 5(f), top electrode 124, 224, and 324 which are formed in a common process in regions 100, 200, 300, on top of the sub-layer 130-3.

As the result of the above process, capacitor 102 in region 100 has three sub-layers 130-1, 130-2, and 130-3 to form the capacitor insulator, while capacitor 202 in region 200 has only one sub-layer 130-3 to form the capacitor insulator, and capacitor 302 in region 300 has two sub-layers 130-3 and 130-2 to form the capacitor insulator. The three capacitors formed in three regions have different number of sub-layers of capacitor insulator, leading to different capacitance for different functions. Moreover, the bottom electrode and the top electrode of the capacitors are formed in a common process. The number of sub-layers and the number of capacitors in each region are only shown for illustrative purposes and are not limiting.

Figure 6:
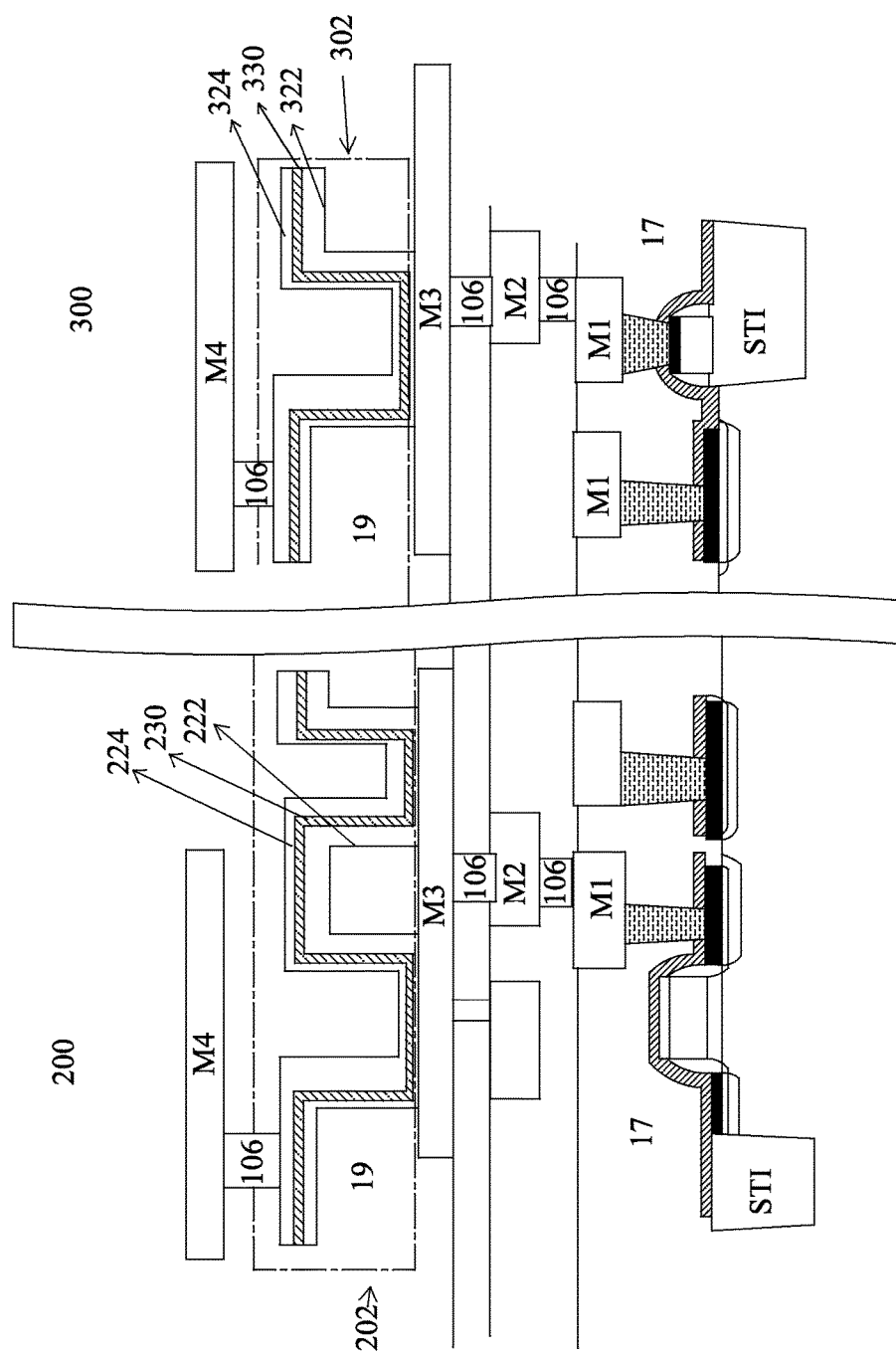
FIG. 6 illustrates two regions each with a capacitor formed in an IMD layer rather than ILD layer.

In FIG. 6, in an alternative embodiment, capacitors 202 in region 200 and 302 in region 300 are formed in layers higher than ILD 17, for example, in any of the dielectric layers known as inter-metal dielectrics (IMDs) 19, which are commonly known in the art as being the dielectric layers for forming metal lines and vias therein. Further, the IMDs are higher than metallization layer M1. Only two regions 200 and 300 are shown. Other number of regions and capacitors are possibly formed in the IMD layer 19.

In FIG. 6, capacitor 202 is formed in region 200 in IMD layer 19, which is above the third metal layer M3 and below the fourth metal layer M4. The metal layers M1, M2, M3, and M4 are connected by vias 106. The number of metal layers and IMD layers, and the number of vias are only shown for illustrative purposes and is not limiting. Similarly, bottom electrode 222 of capacitor 202 and bottom electrode 322 of capacitor 302 are formed in a common process, and hence are formed of a same conductive material. Further, top electrodes 224 and 324 are formed in a common process, and hence are formed of a same conductive material. Capacitor insulator 230 is in between, and contacting, bottom electrode 222 and top electrode 224. Capacitor insulator 330 is in between, and contacting, bottom electrode 322 and top electrode 324. Insulator 230 and 330 may contain multiple sub-layers, made of different material of different thickness.

The embodiments of the present invention have several advantageous features. By integrating capacitors in different functional regions, the process steps and complexity for forming multiple functional capacitors are reduced. The reliability and chip-area usage of the capacitors, on the other hand, are improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit device comprising:
   a semiconductor substrate;
   a first dielectric layer over the semiconductor substrate, the first dielectric layer comprising a portion in each of a first device region, a second device region, and a third device region;
   a second dielectric layer comprising a portion in each of the first device region and the third device region, wherein the second device region is free from the second dielectric layer;
   a third dielectric layer in the first device region, wherein the second device region and the third device region are free from the third dielectric layer, wherein in the first device region, the second dielectric layer is over the third dielectric layer, and the first dielectric layer is over the second dielectric layer;
   a bottom electrode layer comprising a first portion, a second portion, and a third portion in the first device region, the second device region, and the third device region, respectively;
   a top electrode layer comprising a first portion, a second portion, and a third portion in the first device region, the second device region, and the third device region, respectively, wherein:

the first portion of the bottom electrode layer and the first portion of the top electrode layer form a bottom electrode and a top electrode, respectively, of a first capacitor, and the portions of the first, the second and the third dielectric layers in the first device region form a capacitor insulator of the first capacitor;

the second portion of the bottom electrode layer and the second portion of the top electrode layer form a bottom electrode and a top electrode, respectively, of a second capacitor, and the portion of the first dielectric layer in the second device region forms a capacitor insulator of the second capacitor; and the third portion of the bottom electrode layer and the third portion of the top electrode layer form a bottom electrode and a top electrode, respectively, of a third capacitor, and the portions of the first and the second dielectric layers in the third device region form a capacitor insulator of the third capacitor.

2. The integrated circuit device of claim 1, wherein the portions of the first, the second and the third dielectric layers in the first device region form stacked layers, and a top surface and a bottom surface of the stacked layers is in contact with the top electrode and the bottom electrode, respectively, of the first capacitor.

3. The integrated circuit device of claim 1, wherein the bottom electrode and the top electrode of the second capacitor are both in physical contact with the portion of the first dielectric layer in the second device region.

4. The integrated circuit device of claim 1, wherein the portions of the first and the second dielectric layers in the third device region form stacked layers, and a top surface and a bottom of the stacked layers is in contact with the top electrode and the bottom electrode, respectively, of the third capacitor.

5. The integrated circuit device of claim 1, wherein total counts of dielectric layers in the capacitor insulators of the first capacitor, the second capacitor, and the third capacitor are three, one, and two, respectively.

6. The integrated circuit device of claim 1, wherein each of the first capacitor comprises:
    two substantially vertical portions; and
    a bottom portion connected to bottom ends of the two substantially vertical portions.

7. The integrated circuit device of claim 1, wherein each of the first capacitor comprises:
    two substantially vertical portions; and
    a top portion connected to top ends of the two substantially vertical portions.

8. An integrated circuit device comprising:
    a first dielectric layer;
    a second dielectric layer;
    a third dielectric layer;
    a first bottom electrode and a first top electrode forming portions of a first capacitor, wherein a first capacitor insulator of the first capacitor comprises a portion from each of the first, the second, and the third dielectric layers, wherein in the first capacitor insulator, the second dielectric layer is over the first dielectric layer, and the third dielectric layer is over the second dielectric layer;
    a second bottom electrode and a second top electrode forming portions of a second capacitor, wherein a second capacitor insulator of the second capacitor comprises a portion of the third dielectric layer, and is free from portions from the first dielectric layer and the second dielectric layer; and
    a third bottom electrode and a third top electrode forming portions of a third capacitor, wherein a third capacitor insulator of the third capacitor comprises portions of the first and the second dielectric layers, and is free from portions from the third dielectric layer.

9. The integrated circuit device of claim 8, wherein the first capacitor insulator and the second capacitor insulator have different thicknesses.

10. The integrated circuit device of claim 8, wherein the first capacitor insulator comprises a first number of sub-layers, and the second capacitor insulator comprises a second number of sub-layers, with the second number different from the first number.

11. The integrated circuit device of claim 10, wherein total counts of dielectric layers in capacitor insulators of the first capacitor, the second capacitor, and the third capacitor are three, one, and two, respectively.

12. The integrated circuit device of claim 8, wherein the first capacitor, the second capacitor, and the third capacitor are in different device regions selected from a group consisting essentially of a mixed signal region, an analog region, a radio frequency region, and a dynamic random access memory region.

13. The integrated circuit device of claim 8, wherein the first capacitor insulator comprises:
    two substantially vertical portions; and
    a top portion connected to top ends of the two substantially vertical portions.

14. The integrated circuit device of claim 13 further comprising:
    a bottom electrode between the two substantially vertical portions of the first capacitor insulator, wherein a bottom surface of the bottom electrode is substantially coplanar with bottom surfaces of the first capacitor insulator.

15. The integrated circuit device of claim 14, wherein the first capacitor insulator further comprises horizontal portions connected to bottom ends of the two substantially vertical portions, and the integrated circuit device further comprises a metal contact having a top surface in contact with the bottom surface of the bottom electrode and the bottom surfaces of the horizontal portions of the first capacitor insulator.

16. An integrated circuit device comprising:
    a semiconductor substrate;
    a first capacitor in a first region of a chip, the first capacitor comprising:
        a first bottom electrode over the semiconductor substrate;
        a first capacitor insulator overlying and contacting the first bottom electrode, wherein the first capacitor insulator comprises a plurality of dielectric layers, and the plurality of dielectric layers comprises a bottom layer and a top layer over the bottom layer;
        a first top electrode overlying and contacting the first capacitor insulator; and
    a second capacitor in a second region of the chip, the second capacitor comprising:
        a second bottom electrode, wherein the first bottom electrode and the second bottom electrode are substantially at a same level, and are formed of a same material;
        a second capacitor insulator overlying and contacting the second bottom electrode, wherein the first capacitor insulator and the second capacitor insulator are different from each in either thicknesses or materials, wherein the second capacitor insulator is free from a layer that is formed of a same material as the bottom layer in the first capacitor insulator; and a second top electrode overlying and contacting the second capacitor insulator, wherein the first top electrode and the second top electrode have a same thickness, and are formed of a same material.

17. The integrated circuit device of claim 16, wherein the first capacitor insulator and the second capacitor insulator have different thicknesses.

18. The integrated circuit device of claim 16, wherein the first capacitor insulator and the second capacitor insulator comprise different materials.

19. The integrated circuit device of claim 16, wherein the first capacitor insulator comprises a first number of sub-layers, and the second capacitor insulator comprises a second number of sub-layers, with the second number different from the first number.

20. The integrated circuit device of claim 19, wherein the first capacitor insulator comprises:

a first sub-layer; and a second sub-layer overlying and contacting the first sub-layer, wherein the second capacitor has a single layer, with a bottom surface and a top surface of the single layer in contact with the second bottom electrode and the second top electrode, respectively, and wherein the single layer of the second capacitor has a same thickness as, and is formed of a same material as, one of the first sub-layer and the second sub-layer.

* * * * *